(12) United States Patent
Thompson et al.

(10) Patent No.: US 12,153,084 B2
(45) Date of Patent: Nov. 26, 2024

(54) SYSTEM AND METHOD FOR DETECTING DEFECTIVE BACK-DRILLS IN PRINTED CIRCUIT BOARDS

(71) Applicant: R & D Circuits, Inc., South Plainfield, NJ (US)

(72) Inventors: Donald Eric Thompson, Fremont, CA (US); Thomas Smith, Easton, PA (US)

(73) Assignee: R & D Circuits, Inc., South Plainfield, NJ (US)

( * ) Notice: Subject to any disclaimer, the term of this patent is extended or adjusted under 35 U.S.C. 154(b) by 79 days.

(21) Appl. No.: 17/173,441

(22) Filed: Feb. 11, 2021

(65) Prior Publication Data
US 2022/0252660 A1 Aug. 11, 2022

(51) Int. Cl.
*G01R 31/28* (2006.01)
*G01R 31/70* (2020.01)
(Continued)

(52) U.S. Cl.
CPC ......... *G01R 31/2812* (2013.01); *G01R 31/70* (2020.01); *H05K 3/0047* (2013.01); *H05K 3/429* (2013.01)

(58) Field of Classification Search
CPC ...... H05K 3/0047; H05K 3/429; H05K 1/115; H05K 2203/0242; H05K 2201/09536; H05K 1/0298; H05K 3/4038; H05K 2201/09627; H05K 1/0268; H05K 2201/09718; H05K 3/222; H05K 3/40; H05K 2201/09063; H05K 3/42; H05K 2201/09609; H05K 2201/09854; H05K 3/46; H05K 3/4644; H05K 3/4652; H05K 1/18; H05K 2201/10545; H05K 3/00; H05K 3/0005; H05K 3/4069; H05K 2201/041; H05K 2201/0715; H05K 2201/093;
(Continued)

(56) References Cited

U.S. PATENT DOCUMENTS 3,859,711 A * 1/1975 McKiddy ........... G01R 31/2805
174/266
4,894,606 A * 1/1990 Paur ..................... H05K 3/4638
174/266

(Continued)

FOREIGN PATENT DOCUMENTS

CN 105430913 A 3/2016
CN 108260291 7/2018
(Continued)

*Primary Examiner* — Vinh P Nguyen

(57) ABSTRACT

A method for detecting failed back-drills in PCBs in the process of fabricating a PCB so that the failed back-drill can be screened out or repaired. short to ground connection is added for every back-drill via that will be cut when the back-drill removes the via stub. If the back-drill is bad or failed the short to ground will fail the subsequent electrical tests. The PCB can be repaired by re-drilling the hole or via. Failed back-drills may be detected in the manufacturing stage using standard equipment and test procedures. This process creates a simple pass-fail measurement that uses an existing common test process to catch failed back drills in the PCB fabrication facility. This allows for easy and cost-effective repair and guarantees back-drill failures do not pass into the field.

13 Claims, 4 Drawing Sheets

(51) Int. Cl.
*H05K 3/00* (2006.01)
*H05K 3/42* (2006.01)

(58) Field of Classification Search
CPC ... H05K 2201/09418; H05K 2201/094; H05K 2201/0949; H05K 1/14; H05K 2203/061; G01R 31/2812; G01R 31/70; G01R 1/0416; G01R 31/2805; G01R 1/06761; G01R 1/06733; G06F 30/39; G06F 15/7867; G06F 2115/12; G06F 30/20
See application file for complete search history.

(56) References Cited

U.S. PATENT DOCUMENTS

| | | | | |
|---|---|---|---|---|
| 7,096,555 | B2 * | 8/2006 | Tourne | H05K 3/429 |
| | | | | 29/402.06 |
| 7,388,394 | B1 * | 6/2008 | Primavera | H05K 3/4638 |
| | | | | 324/750.3 |
| 7,669,321 | B1 * | 3/2010 | Levy | H05K 1/0268 |
| | | | | 29/402.06 |
| 8,212,154 | B2 * | 7/2012 | Kashiwakura | H05K 1/116 |
| | | | | 174/262 |
| 8,222,537 | B2 * | 7/2012 | Dudnikov, Jr. | H05K 1/0257 |
| | | | | 174/262 |
| 8,431,834 | B2 * | 4/2013 | Twardy | H05K 3/0047 |
| | | | | 174/266 |
| 8,542,494 | B2 * | 9/2013 | Mutnury | H05K 1/024 |
| | | | | 361/748 |
| 9,084,353 | B2 * | 7/2015 | De Geest | H05K 1/024 |
| 9,277,645 | B2 * | 3/2016 | Moul | H05K 1/183 |
| 9,351,395 | B2 * | 5/2016 | Moul | H05K 1/0253 |
| 9,354,270 | B2 * | 5/2016 | Moran | G01B 5/066 |
| 9,560,742 | B2 * | 1/2017 | Brown | H05K 3/429 |
| 9,781,844 | B2 * | 10/2017 | Iketani | H05K 1/115 |
| 2005/0128672 | A1 | 6/2005 | Tourne et al. | |
| 2010/0314163 | A1 | 12/2010 | Twardy et al. | |
| 2021/0014979 | A1 | 1/2021 | Adler et al. | |

FOREIGN PATENT DOCUMENTS

| | | |
|---|---|---|
| CN | 109843000 | 6/2019 |
| EP | 2420115 A1 | 2/2012 |
| KR | 10-2017-0029291 | 3/2017 |
| KR | 10-2017-0067846 | 6/2017 |

* cited by examiner

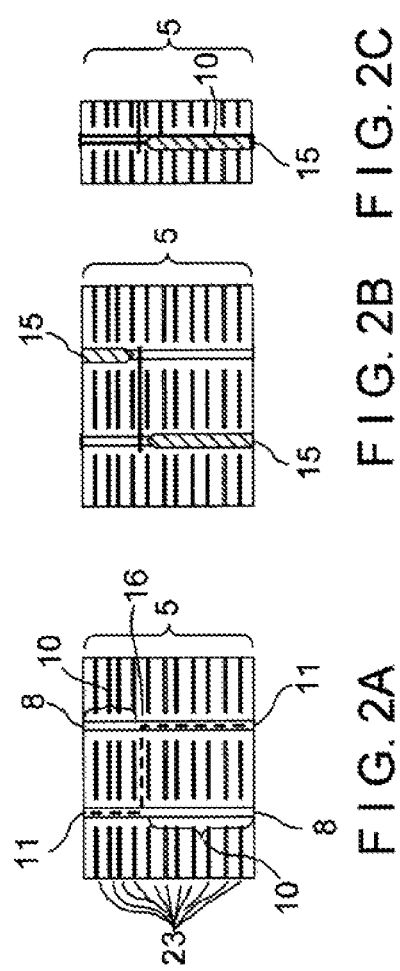
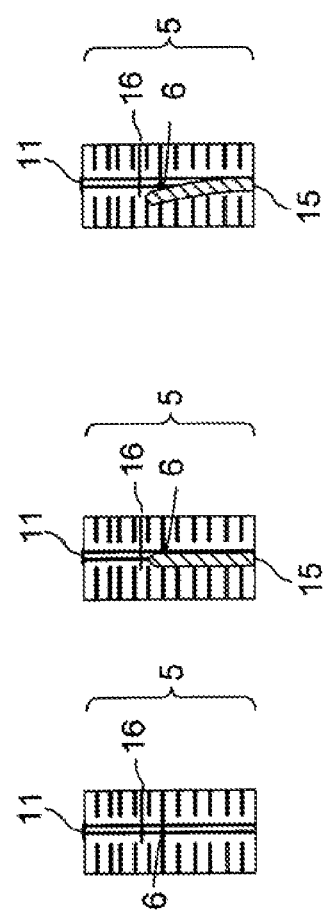

SYSTEM AND METHOD FOR DETECTING DEFECTIVE BACK-DRILLS IN PRINTED CIRCUIT BOARDS

BACKGROUND

1. Field

The present invention relates to back drilling in printed circuit boards (PCBs). In particular the present invention relates to detecting poor or failed back-drills in printed circuit boards.

A failed back-drill in a PCB is one that does not remove all of the metal in the drilled hole or via. This can be due to any of a variety of reasons during the PCB fabrication process such as a drill-misalignment. FIG. 1 Illustrates drill misalignment. A failed drill-back will leave a conductive path of some or all of the length of the drilled via. The via stub created by the failed drill-back results in a degradation of high frequency signals in that path in the PCB.

1. The Related Prior Art

Common PCB testing is accomplished by measuring opens and shorts by employing a flying-probe test. However, these testers are not able to detect a failed back-drill. It is necessary to utilize high-speed test tools such as a Vector Network Analyzer or a Time domain Reflectometer in order to see the failed back-drill but these tools are expensive, difficult to implement in scale and produce difficult to analyze results. Visual inspection has a limited success rate of detecting back-drill problems and 3 D X-rays machines are both expensive and unreliable.

SUMMARY

It would therefore be advantageous to have a novel method for detecting failed or poor back-drills in PCBs that avoids the drawbacks of the aforementioned prior art proposals.

The present invention provides a method for detecting failed back-drills in PCBs early in the process of fabricating a PCB so that the failed back-drill can be screened out or repaired.

The present invention accomplishes this by adding a short to ground connection near the signal layer for every back-drill. This short to ground connection is cut by a successful back-drill. If the back-drill is bad or failed it will leave the connection to ground and fail the electrical test with a short to ground being detected. The PCB can be repaired by re-drilling the hole or via.

BRIEF DESCRIPTION OF THE DRAWINGS

FIG. 2A shows the selected, configured or design PCB with a transmission line consisting of a via, a signal trace, another a via, and two stubs before back-drilling FIG. 2B shows shorting the signal trace to ground in a hole or a via of the PCB;

FIG. 2C shows a bad back-drill failure due to drill shift;

FIG. 2D shows a bad back-drill failure due to drill wander;

FIG. 2E shows a bad back-drill failure due to shallow drill;

FIG. 2F shows one example of electrical connection to ground failure;

FIG. 2G shows another example of electrical connection to ground failure;

FIG. 2H shows another example of electrical connection to ground failure;

FIG. 2I illustrates a back-drill cutting an electrical connection to a power plane;

FIG. 2J shows two back-drills that removed a two via stubs;

FIG. 3 shows one method of how the invention can be automated in the PCB design process and integrated with manufacturing the PCB for opens and shorts to determine if, among other things, all of the back-drills removed all of the short to ground connections.

DETAILED DESCRIPTION OF THE PREFERRED EMBODIMENTS

Figure 1A:
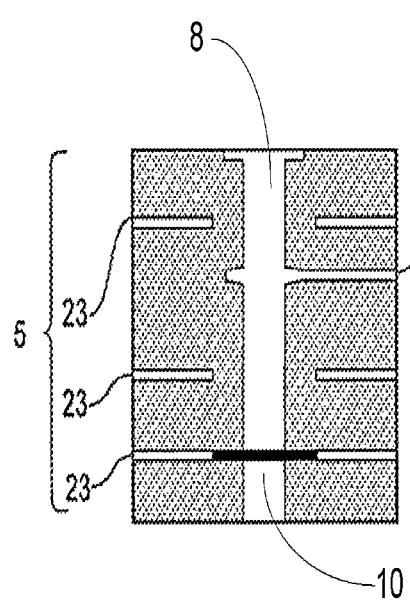
FIG. 1A shows the placement of the short to ground near a signal layer of the PC.
Figure 1B:
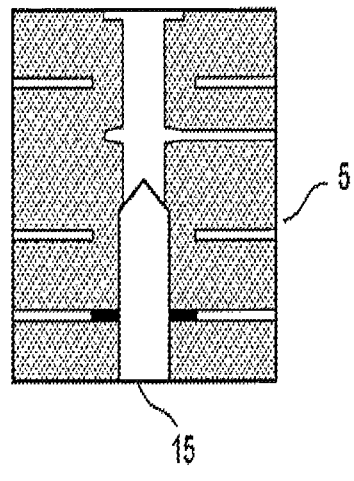
FIG. 1B shows a good back-drill in a PCB.
Figure 1C:
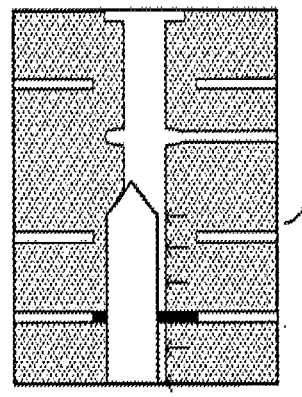
FIG. 1C shows a bad back-drill in a PCB.

The referenced elements for the present invention include:
1. PCB 5.

As is known in the art, a printed circuit board, e.g., PCB 5, typically comprises a plurality of layers, e.g., ground or power layers 23 and signal level layers 16. These exemplary layers are illustrated in cross sectional views in FIGS. 1A, 1B, 1C, 2A, 2B, 2C, 2D, 2E, 2F, 2G, 2H, 2I, and 2J. An exemplary signal layer 16 is illustrated in plan view in FIG. 4. A plurality of vias 8 provide electrical coupling for traces formed on different layers of the PCB. For example, as illustrated in FIG. 2A, a first instance of via 8 couples a portion of signal path 11 on a first layer of the PCB to a second layer of the PCB, while a second instance of via 8 couple couples another portion of signal path 11 from the second layer of the PCB to a third layer of the PCB.

2. Via or hole 8.
3. Shorting trace 10
4. Signal level or trace or stripline 16
5. Back-drill 15.
6. Ground or power plane 23.
7. Transmission line or signal path 11.

A printed circuit board (PCB) has two opposing external major surfaces, one or both of which may bear circuitry, including, for example, conductive traces or patterns. In addition, multilayer PCBs are well known in which one or more layers of conductive traces or patterns are disposed in between the two opposing external major surfaces. Vias are commonly used to connect signals on any one of these layers to any other one of these layers. A via is generally a hole that is drilled or otherwise formed in the PCB and plated or filled with copper or another conductor. Vias may pass through the entire PCB, or have a limited extent, e.g., a via may pass through some but not all layers of a PCB. Vias generally electrically couple traces on two or more layers of a PCB, and are generally electrically isolated from some layers of the PCB.

FIG. 1A illustrates an exemplary cross sectional view of a portion of a multi-layer printed circuit board (PCB) 5, in accordance with embodiments of the present invention. PCB 5 comprises a plurality of layers, including multiple power or ground plane layers 23, and at least one signal layer, e.g. a layer primarily for conducting signals that are not ground of power. Such layers may be known as or referred to as non ground and/or non power layers. Signal trace 16 is on a signal layer. Via 8 is a portion of signal path 11 (FIG. 2A). Via 8 conducts a portion of signal path 11 from one signal layer, e.g., a layer comprising signal trace 16, to a portion of signal path 11 located on a different signal layer, for example, on a top surface of PCB 5. Referring now to the drawings, FIG. 1A, in accordance with the teachings of the present invention illustrates the methodology of the present invention wherein in the PCB design a short to ground connection 10 (hereinafter referred to as a shorting trace 10) is added into the design a programmed distance from the signal trace 16 that electrically connects or shorts the signal via 8 to ground. Thus there is a placement of the shorting trace 10 near a signal trace 16 of the PCB 5. Therefore if, for example, a 10 mil±5 mils back-drill 15 is drilled in a hole or via 8 of the PCB 5, the shorting trace 10 is placed on the first ground layer 16 mils past the signal trace or strip line 16. When a successful back-drill operation is performed the back-drill 15 breaks the electrical connection between signal trace 16 and ground. If the back-drill 15 fails it will leave a path of conductive material in the signal via 8 that will still short signal trace 16 to ground 10 at that sign at that signal trace 16. A failed back-drill is illustrated in FIGS. 2H, 2G and 2I. A good back-drill is shown FIG. 1B FIG. 2J.

Figure 4:
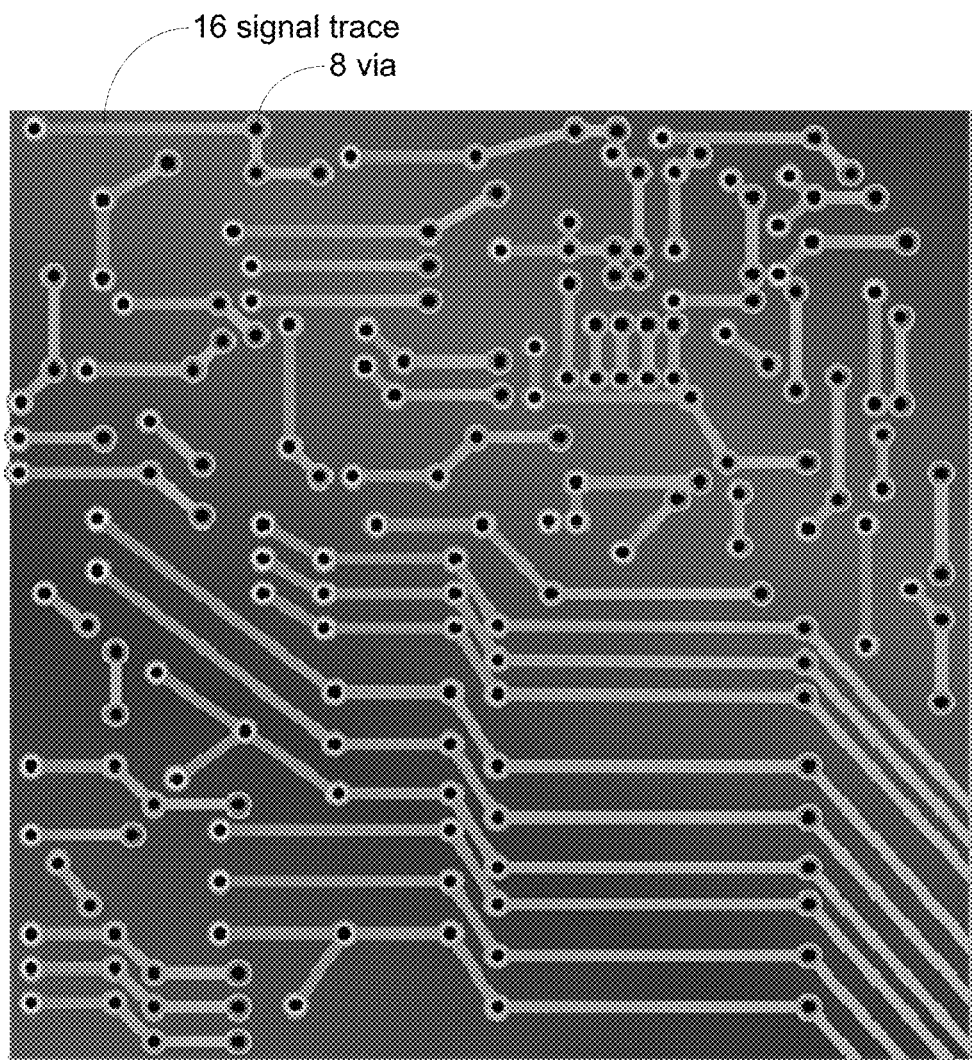
FIG. 4 illustrates a plan view of a portion of an exemplary layer of a printed circuit board, in accordance with embodiments of the present invention.

FIG. 4 illustrates a plan view of a portion of an exemplary layer of a printed circuit board (PDB) 5, in accordance with embodiments of the present invention. The layer comprises a number of conductive traces or patterns. Signal trace 16 is a portion of signal path 11 (FIG. 2A). As previously presented, e.g., with respect to FIG. 2A, signal path 11 comprises traces, e.g., signal trace 16 on the illustrated layer, and other signal trace(s) on other layer(s) of PCB 5. Via 8 (non ground via) couples signal trace 16 of signal path 11 with one or more other signal traces of signal path 11 on other layer(s) of the PCB. Via 8 may also be used for testing, e.g., as a test point or test via, in some embodiments.

FIG. 2A shows a PCB with transmission line path 11 from top left to bottom right. The transmission line comprises a via 8, a trace or stripline 16, and a via 8. Via stubs 10 are also present. The via 8 is nominally not coupled to ground, e.g., the line path 11, comprising via 8, is not schematically coupled to ground. The via 8 may be known as or referred to as a non-ground via. Similarly, via 8 is nominally not coupled to power and may be known as or referred to as a non power via.

FIG. 2B shows a shorting trace 6 connecting the via 11

FIGS. 2C-2E show common back-drill failure modes.

FIG. 2C shows a back-drill failure due to drill shift. FIG. 2E shows a bad back-drill failure due to drill wander. Drill wander is when a drill does not drill straight down into the PCB 5 but instead curves away from a straight up or down path FIG. 2F shows a back-drill failure due to shallow drill. A shallow drill is one that leaves a stub 10 longer than the maximum stub length allowed.

FIGS. 2F-2H show common back-drill failure modes with a shorting trace 6 connecting signal to ground.

FIG. 2I shows a back-drill 15 that cuts the shorting trace signal to ground or power plane 23 connection.

FIG. 2J shows a PCB 5 with back-drill 15 that removed the via stubs 8.

Figure 3:
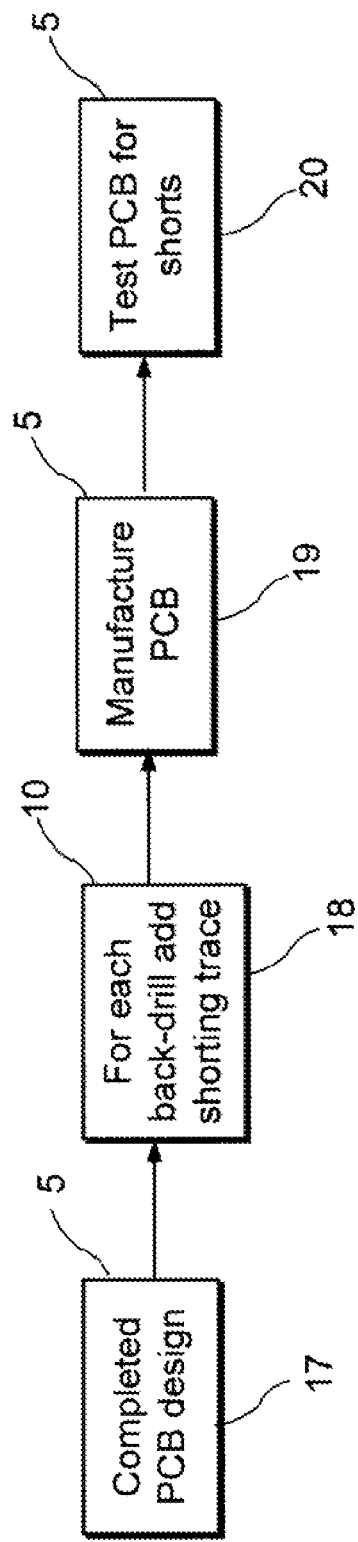
FIG. 3 illustrates the methodology of the present invention.

FIG. 3 illustrates the methodology of the present invention. In FIG. 3 illustrates a first step of the methodology of the present invention in which a design or configured PCB 5 is selected. Next FIG. 3 shows a second step 18 in which shorting traces 10 are added to back-drilled vias 8 in the PCB 5 design.

FIG. 3 illustrates a third step of the methodology in which the PCB 5 is designed 17 and subsequently the electronic design files are modified using automated software 18 to add shorting traces for each back-drilled via. The PCB 5 is then manufactured 19 using common PCB manufacturing techniques. It is then tested 20 to verify each transmission line 11 is electrically isolated from ground 23 to confirm the back-drill 15 cut the shorting trace confirming a good back-drill. Such testing may be performed by a well-known "flying-probe test." For example, a flying probe test places a first probe on a first via, e.g., via 8, and a second probe on a second via, and tests for continuity between the first and second vias. A via used in this manner for testing may be know as, or referred to as a test signal via or test point. In general, any via may be used for testing, and any signal path may be used as a test signal. As is known, there may be dedicated test signals and/or signal paths, e.g., a signal path used only for testing. If there is a short, e.g., transmission line 11 is coupled to ground, then the back-drill 15 has failed and the PCB 5 must be discarded or repaired.

The methodology of the claimed invention is preferably software implemented in the following steps:
1. Execute the program and select the design files
2. There are three sections
   Back Drill
   Compare IPC
   Compare Shorts
3. The first section "Back Drill" will update all hack drill vias to create intentional short to ground
4. The second section "Compare IPC" will compare the board files before and after intentional short to verify correct functionality
5. The third section "Compare Shorts" compares the error checking output files to the expected errors that are generated from this software. The shorting of a signal via to ground will create a DRC error that other computer aided manufacturing software will detect. CAM 350 is an example of Gerber Computer Aided Manufacturing tool that will detect said errors. This section will make sure that other unrelated errors are separated from errors caused by this process B. Back-Drill program details
1. User implements the following parameters:
   a. Via stub length: This value is the minimum stub length before a short can be added (E.g. 10 mils)
   b. Ground net: This is the name of the ground net in the PCB design software. (E.g. "VSS")
   c. Copper Web: This value is the copper web in the custom antipad allowing ground copper to flow in the back drill vias by default the tool will use a value of 5 mils.
   d. Copper Diameter: This is the copper diameter around the hole.
   Program steps include:
2. Execute program:
   a. Load PCB design file
   b. Loop through all back drilled via locations
   c. Start at trace depth, define this as position 0
   d. Subtract "via stub length" from this position 0 (E.G. 0-10=-10)
   e. Start at this calculated position and look for closest "Ground net" copper plane while moving away from the trace location. (E.G. "VSS" layer located at -16.5 mils")
   f. Add shorting feature defined by "Ground Web" and "Copper Diameter" (E.G. see picture)

g. Rename design file via name to customer name indicating anti-pad modification. <image.png> h. Create report file indicating changes made

The methodology of the present invention is assisted from tools improvements in a typical PCB design flow. All common PCB design tools have a design rule check, also known as DRC that looks for nets that are shorted together as well as other error checking. A program or script adds the shorting trace 10 at all back-drill 15 locations and adjusts the depth of the shorting trace 10 by the tolerance of the back-drill 15 and the depth of the signal trace 6.

Once the shorting traces 10 are added the common PCB design or Gerber files then computer added manufacturing, A.K.A. CAM, tools will show DRC errors. The back-drill shorting trace 10 DRC flags must be identified and screened out so DRC flags for legitimate errors are caught and fixed. It is understood that although copper web is preferably used any suitable electrically conductive metallic material can be used.

While presently preferred embodiments have been described for purposes of the disclosure, numerous changes in the arrangement of method steps and apparatus parts can be made by those skilled in the art. Such changes are encompassed within the spirit of the invention as defined by the appended claims

The invention claimed is:

1. A printed circuit board (PCB) comprising:
a plurality of layers comprising conductive traces;
a plurality of vias configured to electrically couple said traces formed on different layers of said plurality of layers of said PCB; and
a shorting trace from a non-ground via to a ground plane of said PCB.

2. The printed circuit board (PCB) of claim 1 wherein the non-ground via is physically and electrically isolated from the ground plane due to back-drilling of the PCB.

3. The printed circuit board (PCB) of claim 1 wherein subsequent to back-drilling of the PCB, the non-ground via is electrically coupled to the ground plane.

4. The printed circuit board (PCB) of claim 1 wherein the shorting trace comprises a stub length of 10 mils plus or minus 5 mils.

5. The printed circuit board (PCB) of claim 1 wherein the shorting trace is disposed on a power or ground plane layer of the PCB.

6. The printed circuit board (PCB) of claim 1 wherein the shorting trace is disposed on a signal layer of the PCB.

7. The printed circuit board (PCB) of claim 1 comprising a plurality of said shorting traces on a plurality of layers of the PCB.

8. A printed circuit board (PCB) comprising:
a plurality of layers comprising conductive patterns;
a plurality of vias configured to electrically couple traces formed on different layers of said plurality of layers; and
a shorting trace from a non-power via to a power plane, wherein said power plane is one of said plurality of layers, and
wherein the non-power via is physically and electrically isolated from the power plane due to back-drilling of the PCB.

9. The printed circuit board (PCB) of claim 8 wherein subsequent to back-drilling of the PCB, the non-power via is electrically coupled to a power plane.

10. The printed circuit board (PCB) of claim 8 wherein the shorting trace comprises a stub length of 10 mils plus or minus 5 mils.

11. The printed circuit board (PCB) of claim 8 wherein the shorting trace is disposed on a ground plane or power plane layer of the PCB.

12. The printed circuit board (PCB) of claim 8 wherein the shorting trace is disposed on a signal layer of the PCB.

13. The printed circuit board (PCB) of claim 8 comprising a plurality of said shorting traces on a plurality of layers of the PCB.

\* \* \* \* \*